United States Patent [19]

Aoki et al.

[11] Patent Number: 4,982,247
[45] Date of Patent: Jan. 1, 1991

[54] SEMI-CONDUCTOR DEVICE

[75] Inventors: Tsuneyoshi Aoki; Masayoshi Kanazawa; Akiyasu Ishitani, all of Kanagawa, Japan

[73] Assignee: Sony Corporation, Tokyo, Japan

[21] Appl. No.: 246,963

[22] Filed: Sep. 21, 1988

Related U.S. Application Data

[63] Continuation of Ser. No. 726,228, Apr. 23, 1985, abandoned.

[30] Foreign Application Priority Data

Apr. 28, 1984 [JP] Japan .................................. 59-87407
Apr. 28, 1984 [JP] Japan .................................. 59-87406

[51] Int. Cl.$^5$ ............................... H01L 29/80; 357 15; 357 23.14
[52] U.S. Cl. ........................................ 357/22; 357/15; 357/23.14
[58] Field of Search .......................... 357/15, 22, 23.14

[56] References Cited

U.S. PATENT DOCUMENTS 3,725,136  4/1973  Morgan .................................. 357/22
4,549,197  10/1985  Brehm et al. ......................... 357/15
4,602,170  7/1986  Bertin ................................. 357/23.14

FOREIGN PATENT DOCUMENTS 015072  3/1980  Japan .

OTHER PUBLICATIONS

IEEE International Solid–State Circuits Conference, vol. 24, Feb. 1981, pp. 70–71, New York, U.S., H. M. Mqcksey et al., "GaAs power FET for K–Bank Operation".

Primary Examiner—Edward J. Wojciechowicz
Attorney, Agent, or Firm—Ronald P. Kananen

[57] ABSTRACT

A semiconductor device, such as a GaAs FET, has low-noise, ultra-high frequency operation. The semiconductor device has at least one bonding pad for applying potential to the gate electrode lying outside of the source region. In practice, one or more bonding pads are deposited in the general vicinity of the gate electrode and outside of the source region. This allows the number of supply points P to be increased without lengthening the source region and thus expanding the chip. With regard to the drain-gate capacitance, the bonding pad or pads can be surrounded by an electrode other than the drain region electrode or the gate electrode to ensure that the drain-gate capacitance is not increased.

26 Claims, 5 Drawing Sheets

FIG. 1
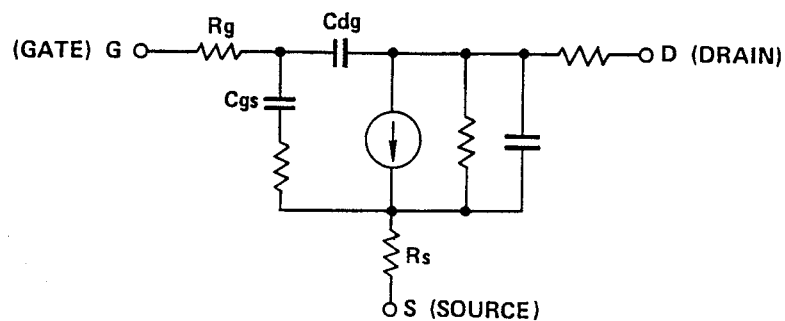
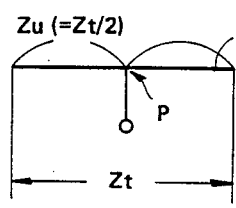
FIG.2(A)
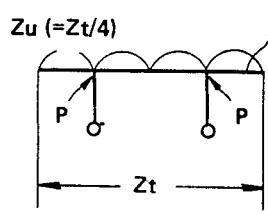
FIG.2(B)
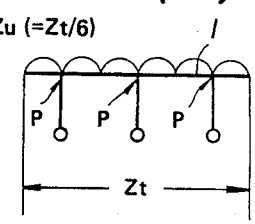
FIG.2(C)
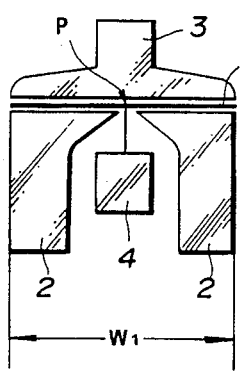
FIG.3(A)
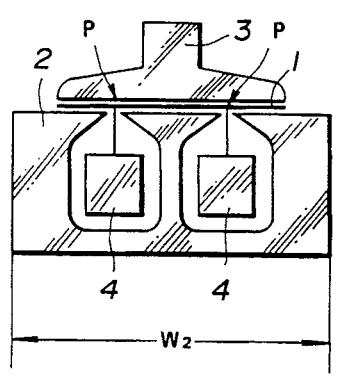
FIG.3(B)
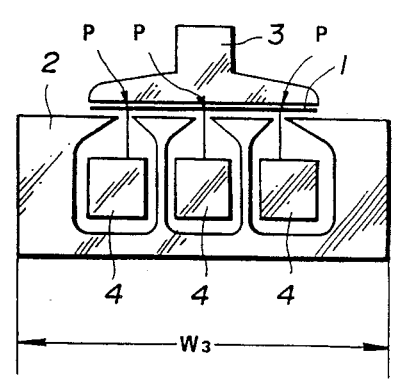
FIG.3(C)

SEMI-CONDUCTOR DEVICE

This application is a continuation of application Ser. No. 726,228, filed Apr. 23, 1985.

BACKGROUND OF THE INVENTION

The present invention relates generally to a semiconductor device having a field-effect transistor (FET) structure. More particularly, the invention relates to an FET, such as a GaAs FET designed for ultra-high frequency operation.

In recent years, satellite broadcasting systems have become increasingly available. In such satellite broadcasting systems, high-quality data, such as image data, pulse-code-modulated signals, and so forth, are broadcast at ultra-high frequencies, e.g. at about 12 GHz. Thus, receiving systems for satellite broadcasting systems have increased the demand for low-noise, ultra-high-frequency FET's.

The ultra-high-frequency FET, such as a GaAs FET can be represented by the equivalent circuit shown in FIG. 1. The noise figure $F_0$ of an FET can be described by the following equation:

$$F_0 = 1 + 2\pi f K_f C_{gs} \sqrt{\frac{(R_g + R_s)}{gm}} \quad (1)$$

where $K_f$ is a unique constant for each individual device, the so-called "fitting factor";

$C_{gs}$ is the gate-source capacitance (=input capacitance)

$R_g$ is the gate resistance at high frequencies;

$R_s$ is the source resistance; and gm is the transmission conductance of the FET.

One way to reduce the noise figure $F_0$ is to reduce the gate resistance $R_g$. The gate resistance $R_g$ can be expressed by the following equation:

$$R_g = \frac{\rho_g Z_u^2}{3 S Z_t} \quad (2)$$

where $\pi_g$ is the resistivity of the gate metal;

S is the cross-sectional area of the gate;

$Z_u$ is the unit gate width, and $Z_t$ is the total gate width.

As shown in FIGS. 2(A) to 2(C), the unit gate width $Z_u$ can be reduced by increasing the number of supply points P relative to the total gate width $Z_t$. For instance, as shown in FIG. 2(A), when one supply point P is active in the gate electrode 1, the unit gate width $Z_u$ becomes $\frac{1}{2}Z_t$. When two supply points P are active, the unit gate width $Z_u$ $\frac{1}{2}Z_t$, as shown in FIG. 2(B). By further increasing the number of supply points to three as shown in FIG. 2(C), the unit gate width $Z_u$ become $1/6Z_t$.

As will be appreciated herefrom, in general, if N supply points are built into the gate electrode 1, the unit gate width $Z_u$ will be $Z_u = Z_t/2N$. Since the gate resistance $R_g$ varies in proportion to the square of the unit gate width $Z_u$, when two supply points are active, the gate resistance $R_g$ the gate electrode 1 will be ¼ of that when a single supply point P is available. Similarly, when three supply points P are provided for the gate electrode 1, the gate resistance $R_g$ will be 1/9 of that when a single supply point is used.

In summary, increasing the number of supply points P in the gate electrode reduces the gate resistance $R_g$ and thus the noise figure $F_0$ significantly.

On the other hand, in order to increase the number of supply points P in the gate electrode 1, an increased number of electrodes, so-called bonding pads, are required to supply the gate potential for the corresponding supply points P. This results in expansion of the gate cell area, resulting in a larger chip overall. For instance, as shown in FIGS. 3(A) to 3(C), a semiconductor device with an FET structure has a source region 2 and a drain region 3 on opposite sides of the gate electrode 1. The bonding pads 4 are installed on the source region side in order to prevent undue increase in the gate-drain capacitance $C_{dg}$. The bonding pads 4 are surrounded by the source region 2 for the sake of shielding. Sine it has been considered essential to shield the bonding pads 4 by surrounding them with the source region metallization, it has been considered inevitable that the total length of the source region 2 will increase as the number of bonding pads 4 increases.

Therefore, as shown FIGS. 3(A) to 3(C), when two bonding pads 4 are connected to two supply points P on the gate electrode 1, as shown in FIG. 3(B), the required total length $W_2$ is greater than that length $W_1$ required for a single bonding pad for a single supply point. Similarly, when three bonding pads 4 is provided for three supply points, the total length $W_3$ of the source region 2 is even greater than that length $W_2$ for two bonding pads. In summary, increasing the number of supply points P in the gate electrode 1 thus results in an increase in the number of bonding pads 4 and in the total length W of the source region. This implies expansion of the gate cell dimensions and thus of the chip overall. Therefore, the finished GaAs FET becomes more expensive due to the increased cost of materials and so forth. In addition, expanding the chip size lowers the production yield of the semiconductor chip and of course expansion of the chip size is considered unfavorable in itself.

As far as the chip area alone is concerned, these problems can be resolved by using a multi-level structure for the semiconductor device. In the multi-level integration structure, the bonding pads 4 need not multiply as the number of supply points P in the gate electrode 1 increases. On the other hand, in the multi-level structure, it is necessary to deposit additional insulating layers by way of the CVD process or the like in order to limit the gate-source capacitance (input capacitance). Furthermore, it is also necessary to form through openings through the insulating layers to allow contacts to establish electrical connections. This results in relatively high production costs.

SUMMARY OF THE INVENTION

Therefore, it is an object of the invention to provide a semiconductor device, such as GaAs FET. which is of simple structure and which suppresses noise in the ultra-high-frequency range.

Another and more specific object of the invention is to provide a semiconductor device which can limit gate resistance $R_g$ and thus reduce the noise figure of the device without requiring expansion of the chip.

In order to accomplish the above-mentioned and other objects, a semiconductor device, according to the present invention, has at least one bonding pad for applying potential to the gate electrode lying outside of the source region.

In practice, one or more bonding pads are deposited in the general vicinity of the gate electrode and outside of the source region. This allows the number of supply points P to be increased without lengthening the source region and thus expanding the chip.

With regard to the gate-source capacitance, the bonding pad or pads can be surrounded by an electrode other than the drain region electrode or the gate electrode to ensure that the gate-source capacitance is not increased.

According to one aspect of the invention, a semiconductor device comprises a semiconductor substrate having a source region and a drain region formed therein, a gate electrode formed on the substrate, a source electrode formed on the substrate and electrically connected to the source region, the source electrode being located at one side of the gate electrode, a drain electrode formed on the substrate and electrically connected to the drain region, the drain electrode being located at the other side of the gate electrode, and means for supplying a potential for the gate electrode, the means including a gate pad connected to a feeding point of the gate electrode, the gate pad lying outside of the source electrode.

According to another aspect of the invention, a field effect transistor comprises a semiconductor substrate, a gate electrode having a plurality of feeding points, a source electrode arranged at a first side of the gate electrode and defining essentially an enclosed space therein, a drain electrode arranged at a second side of the gate electrode, which second side is opposite of the first side with respect to the gate electrode, and means for supplying a potential to the gate electrode through the feeding points, the means including a plurality of gate pads, each of which is connected the corresponding one of the feeding points, the gate pads comprising at least one first pad arranged within the enclosed space of the source electrode and at least one second gate pad arranged outside of the enclosed space.

According to a further aspect of the invention, a field effect transistor comprises a semiconductor substrate, an elongated gate electrode, a source electrode arranged at a first side with respect to the gate electrode, a drain electrode arranged at a second side opposite to the first side with respect to the gate electrode, and means for providing a plurality of feeding points for the gate electrode, through which gating potential is supplied, the means connecting at least one first feeding point connected to a first potential source in a space generally shielded from the gate electrode by the source electrode, and at least one second feeding point connected to a second potential source lying outside of the shielded space.

BRIEF DESCRIPTION OF THE DRAWINGS

The present invention will be understood more fully from the detailed description given herebelow and from the accompanying drawings of the preferred embodiments of the invention, which, however, should not be taken to limit the invention to the specific embodiments, but are for explanation and understanding only.

In the drawings:

FIG. 1, as set forth above, is a schematic diagram of an equivalent circuit for a typical field-effect transistor;

FIGS. 2(A) to 2(C) are diagrams illustrating the relationship between the unit gate resistance $Z_u$ and the number of supply points P;

FIGS. 3(A) to 3(C) are plan views of the electrode arrangement on semiconductor devices employing different numbers of supply points;

DESCRIPTION OF THE PREFERRED EMBODIMENT

Figure 4:
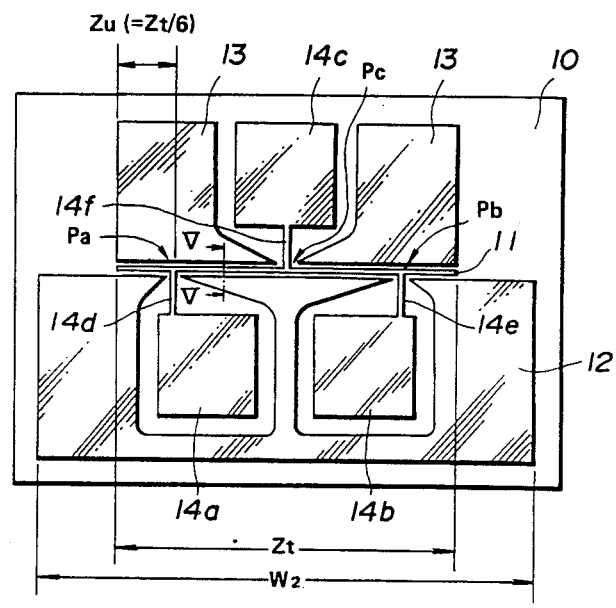
FIG. 4 is a partial plan view of the first embodiment of a semiconductor device according to the present invention.
Figure 5:
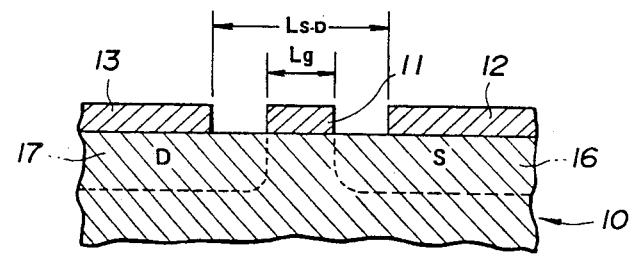
FIG. 5 is a cross-section taken along line V—V of FIG. 4.

Referring to FIGS. 4 and 5, the first embodiment of a semiconductor device according to the invention has a base 10 made of a semiconducting material such as gallium arsenide (GaAs). A gate electrode 11 made of tungsten silicide, aluminum or the like is deposited on the semiconductor base 10 in short-key contact with the base. The gate electrode 11 has gate length $L_g$ and gate width $Z_t$. A source electrode 12 and a drain electrode 13 are disposed on opposite sides of the gate electrode 11.

The semiconductor base 10 has a source region 16 and a drain region 17 formed by diffusion or equivalent processes and having high dopant concentrations and correspondingly low resistances. The source electrode 12 is electrically connected to the source region 16 by direct ohmic contact. Similarly, the drain electrode 13 is electrically connected to the drain region 17 by ohmic contact.

The gate electrode 11 is biased via three supply points Pa, Pb and Pc. The supply point Pc is disposed at the longitudinal center of the gate electrode 11. On the other hand, the supply points Pa and Pb are separated from the respectively corresponding longitudinal ends of the gate electrode 11 by $Z_t/6$. In this arrangement, the unit gate length $Z_u$ is $Z_t/6$. The supply points Pa and Pb are connected to corresponding potential supply electrodes 14a and 14b, or so-called gate bonding pads, which will be referred to hereafter as "gate pads", through electrode leads 14d and 14e. The gate pads 14a and 14b overlie the source region 16 of the base 10 and are surrounded by the source electrode 12. On the other hand, the central supply point Pc is connected to a gate pad 14c via an electrode lead 14f. The gate pad 14c overlies the drain region 17.

Each of the gate pads 14a, 14b and 14c is essentially square in plan view and are approximately 50 μm to 80 μm on a side, in which is considered to be the minimum required for wire bonding. As will be appreciated, the bonding pads of the same size are required for the source electrode 12 and the drain electrode 13. The gate electrode 12 has the gate width $Z_t$ of about 200 μm to 300 μm. If all of the gate pads were embedded in the source electrode as shown in FIG. 3(C), the maximum length would have to be expanded. But in the shown embodiment, by disposing the central gate pad Pc outside of the source electrode and on the drain electrode side, the maximum length of the source electrode 12 becomes equivalent to that illustrated in FIG. 3(B)

wherein two supply points are used for the gate electrode.

On the other hand, locating the gate pad outside of the source electrode 12 on the drain electrode side can be expected to increase the drain-gate capacitance $C_{dg}$ and degrade the shielding effect. Therefore, in the conventional semiconductor device, gate pads have been embedded within the source electrode of apparent necessity. As is well known, the drain-gate capacitance $C_{dg}$ acts as a feedback capacitance between the input and the output of the FET which lowers the gain.

The FET constructed as set forth above has been compared with the conventional FET of FIG. 3(B) which is of approximately the same size as the first embodiment but which has only two supply points. Since the conventional device has only two supply points, the unit gate length is $Z_t/4$. Assuming the FET's of FIGS. 3(B) and 4 have same gate length $L_g=0.05$ μm, and have same gate width $Z_t$ and electrode dimensions including the source gate width $W_2$, the gain Ga at an input signal frequency of 12 GHz will be approximately 9 dB for both FETs. The noise figure NZ of the conventional FET is approximately 1.5 dB. On the other hand, the noise figure NZ of the FET of the shown embodiment is 1.25 dB. Using the conventional geometry, in order to achieve an equivalent noise figure, i.e. 1.25 dB, the gate electrode must have a gate length $L_g$ of only 0.03 μm. Therefore, in the prior art, ultra-fine-resolution technology is needed to achieve a noise figure level of 1.25 dB. According to the shown embodiment, the 1.25 dB noise figure can be achieved with a gate electrode gate length $L_g$ as large as 0.05 μm.

In analysing the above results, it should be noted that although the drain-gate capacitance $C_{dg}$ increases from about 20 fF to 30 fF in the shown embodiment, the favorable effect of the reduction of the gate resistance $R_g$ due to the increase in the number of supply points outweighs this, resulting in a net reduction of the noise figure.

Accordingly, the first embodiment of the semiconductor device of the present invention makes it possible to connect three supply points to the gate electrode for an FET of the same size as a conventional FET using only two supply points. The above-mentioned tests have confirmed that the FET of the first embodiment of the invention achieves a reduced noise figure NF=1.25 dB at ultra-high frequencies, e.g. 12 GHz, which is comparable to that achieved conventionally only by limiting the gate length to 0.3 μm. Furthermore, since the shown embodiment allows a relatively high reduction in the noise figure NF, it is not necessary to employ a multi-level geometry for the sake of reducing noise at ultra-high frequencies nor to use a very thin gate electrode. Thus low-noise, high-performance semiconductor devices can be fabricated without increasing the chip size or employing more complicated manufacturing processes. Therefore, according to the shown embodiment, an excellent cost/performance ratio can be achieved for ultra-high-frequency low-noise FET's.

Figure 6:
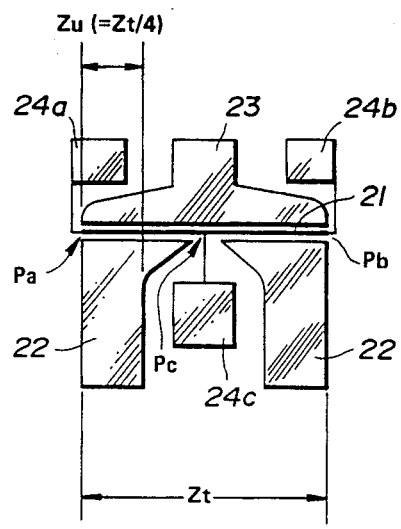
FIGS. 6 to 8 are partial plan views of modifications to the first embodiment of FIG. 4.

FIG. 6 shows a first modification to the first embodiment of the semiconductor device according to the invention. As in the first embodiment, a gate electrode 21 is provided with three supply points Pa, Pb and Pc. The supply points Pa and Pb are connected to opposite longitudinal ends of the gate electrode 21. Therefore, the unit gate length $Z_u$ this case is $Z_t/4$. Gate pads 24a and 24b are disposed opposite the drain electrode 23 from the gate electrode 21. The gate pads 24a and 24b are connected to respectively corresponding supply points Pa and Pb of the gate electrode. In addition, a third gate pad 24c is embedded within the source electrode 22 and connected to the supply point Pc in the usual manner.

In this arrangement, the total length of the source electrode is the same as that of a conventional FET with a single supply point. Therefore, the chip size is comparable to that shown in FIG. 3(A).

It should be noted that, if desired, the positions of the gate pads 24a, 24b and 24c can be reversed. That is, if necessary, the gate pads can be arranged with the gate pads 24a and 24b on the source electrode side and the gate pad 24c on the drain electrode side. Furthermore, in this modified arrangement, a chip size comparable to that shown in FIG. 3(A) can be achieved by locating one of the gate pads 24a and 24b outside of the source electrode.

Figure 7:
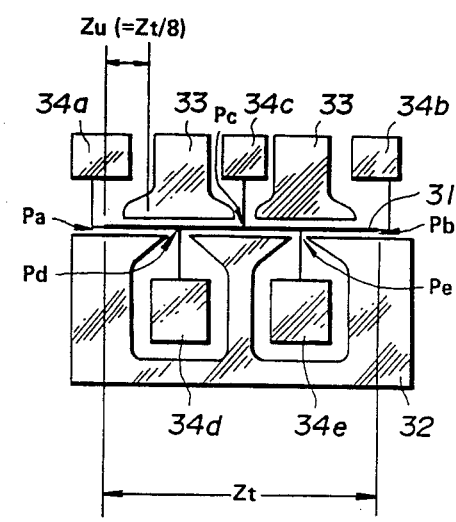

FIG. 7 shows a second modification to the foregoing first embodiment of the present invention. In this arrangement, five supply points Pa, Pb, Pc, Pd and Pe are connected to the gate electrode 31. The supply points Pa and Pb are connected to opposite longitudinal ends of the gate electrode 31. The other three supply points Pc, Pd and Pe are spaced at constant intervals of $Z_t/4$ along the gate electrode 31. Thus, the unit gate length $Z_u$ is $Z_t/8$. The supply points Pd and Pe are connected to gate pads 34d and 34e embedded within the source electrode. The other three supply points Pa, Pb and Pc are connected to respectively corresponding gate pads 34a, 34b and 34c located on the drain electrode side of the gate electrode 32.

As will be appreciated herefrom, by adding two supply points Pa and Pb to the geometry of the first embodiment, the unit gate length $Z_u$ can be reduced to $Z_t/8$ from the $Z_t/6$ value achieved by the first embodiment. In this case, the source electrode 32 can be held to a size comparable to that of the first embodiment of FIGS. 4 and 5.

Figure 8:
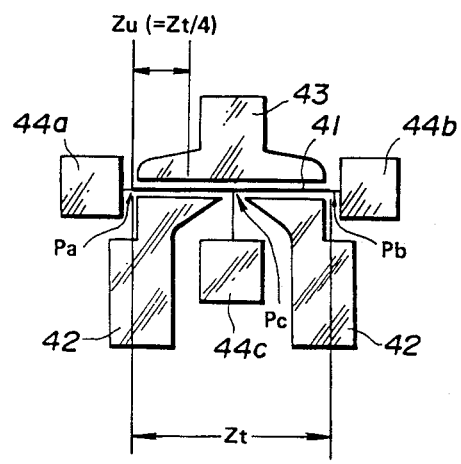

FIG. 8 shows a third modification to the foregoing first embodiment of the semiconductor device, e.g. an FET, according to the invention. As in the first modification, a gate electrode 41 is provided with three supply points Pa, Pb and Pc. The supply points Pa and Pb are at opposite longitudinal ends of the gate electrode. The supply point Pc is at the longitudinal center of the gate electrode. The supply point Pc is connected to a gate pad 44c embedded within the source electrode 42 which is separated into two pieces. The supply points Pa and Pb are connected to gate pads 44a and 44b configured as longitudinal extensions of the gate electrode.

This third modification would have substantially the same properties as the first modification of FIG. 6.

Figure 9:
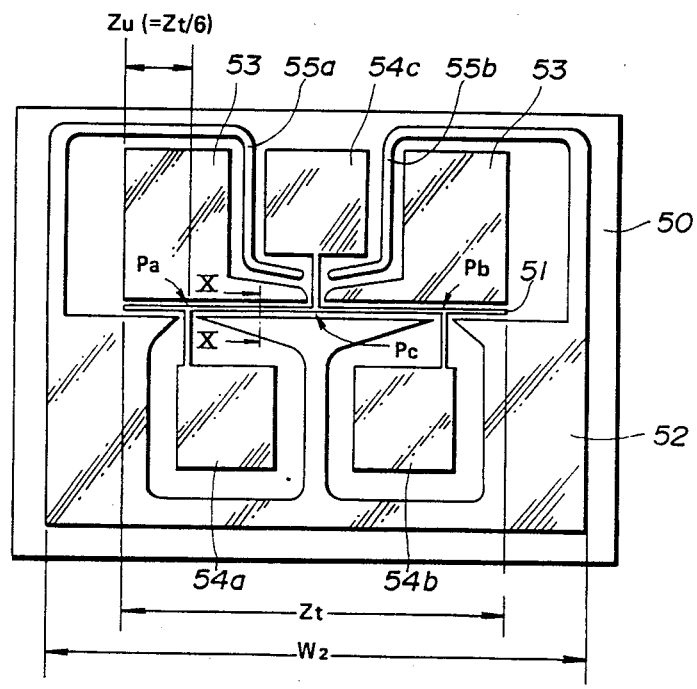
FIG. 9 is a partial plan view of the second embodiment of a semiconductor device according to the invention.
Figure 10:
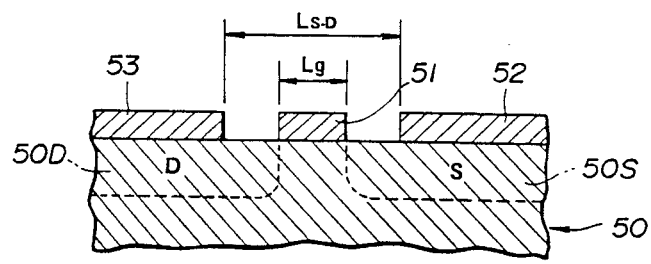
FIG. 10 is a cross-section taken along line X—X of FIG. 9.

FIGS. 9 and 10 show the second embodiment of the semiconductor device according to the invention, which prevents increase in the drain-gate capacitance $C_{dg}$ while allowing the unit gate length $Z_u$ to be shortened to substantially the same degree as in the first embodiment.

In this second embodiment, FET 50 has essentially the same geometry as disclosed with respect to the first embodiment of the invention. For instance, the FET generally comprises a gate electrode 51, a source electrode 52 and a drain electrode 53. As shown in FIG. 10, the source electrode 52 and the drain electrode 53 are located on opposite sides of the gate electrode 51. The edges of the source electrode 52 and the drain electrode 53 opposing the gate electrode 51 are separated by a distance $L_{S-D}$ which is short enough to prevent generation of a gate-source capacitance $C_{gs}$ or a drain-gate capacitance $C_{dg}$ large enough to affect the performance of the FET.

The source electrode 52 is electrically connected to a source region 50S formed in the semiconductor base 50 made, for example, of GaAs. Likewise, the drain electrode 53 is electrically connected to a drain region 50D.

As in the first embodiment, the gate electrode 51 has three supply points Pa, Pb and Pc. The supply point Pc is at the longitudinal center of the gate electrode 51 and supply points Pa and Pb are each located one-sixth of the length of the gate electrode 51 from the opposite longitudinal ends of the gate electrode.

The supply points Pa and Pb are connected to gate pads 54a and 54b respectively which are on the same side of the gate electrode as the source electrode 52 and surrounded by the latter. On the other hand, the supply point Pc is connected to a gate pad 54c which is located on the drain electrode side. The gate pad 54c lies between the two separate elements making up the drain electrode 53.

In this second embodiment, a pair of shielding electrodes 55a and 55b extend from the longitudinal edges of the source electrode 52 past the ends of the gate electrode 51 onto the drain electrode side and partially surround the gate pad 54c. The shielding electrodes 55a and 55b cooperate to isolate the gate pad 54c from the drain electrode 53 in order to limit the drain-gate capacitance $C_{dg}$. In the case shown in FIG. 9, the shielding electrodes 55a and 55b are connected to the source electrode, but this need not necessarily be the case. The shielding electrodes of this second embodiment need only be interposed between the gate pad 54c and the drain electrode 53 to provide the additional effect of preventing the increase in the drain-gate capacity $C_{dg}$ incurred in the first embodiment.

Figure 11:
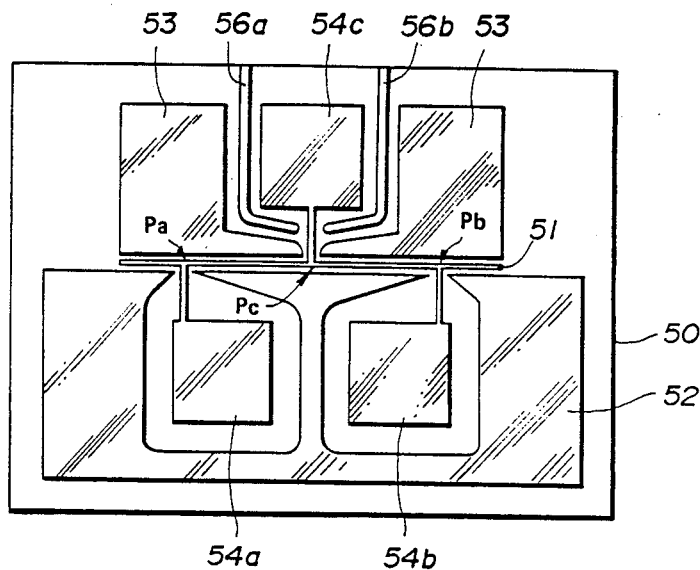
FIGS. 11 to 13 are partial plan views of modifications to the second embodiment of FIG. 9.

As shown in FIG. 11, the shielding electrodes 56a, 56b can be directly connected to the semiconductor substrate 50 for grounding. This geometry has substantially the same effect as the embodiment of FIGS. 9 and 10.

Figure 12:
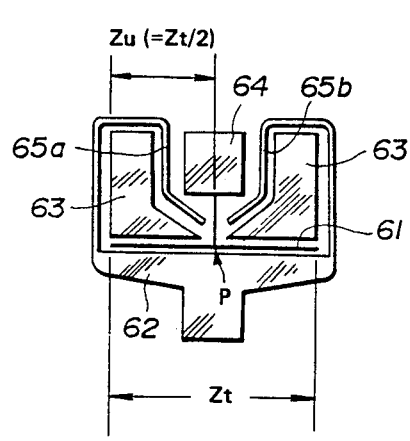

Furthermore, in the shown embodiment, it is possible to use a single gate pad 64 connected to a single supply point P on the gate electrode on the drain electrode side due to the effect of shielding electrodes 65a and 65b, as shown in FIG. 12. In this modification, as in the embodiment shown in FIGS. 9 and 10, the shielding electrodes 65a and 65b are connected to a source electrode 62. In this case, since the source electrode 63 need not accommodate the gate pad, the chip size can be reduced.

Figure 13:
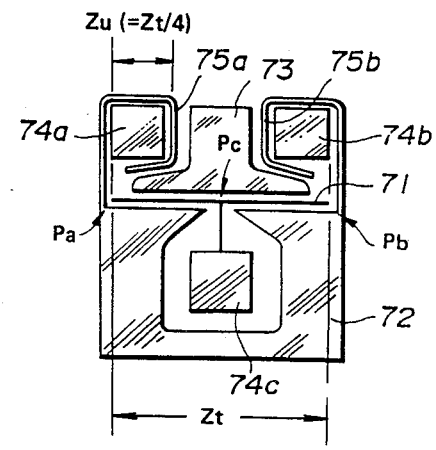

FIG. 13 shows another modification to the second embodiment of FIGS. 9 and 10, which may also be considered to be a modified version of the embodiment of FIG. 6. Gate pads 74a and 74b located to either side of a drain electrode 73 are shielded from the drain electrode by shielding electrodes 75a, 75b. The gate pads 74a and 74b are connected to supply points Pa and Pb of the gate electrode 71. On the other hand, as explained with respect to the embodiment of FIG. 6, a gate pad 74c for a central supply point Pc on the gate electrode 71 is located on the source electrode side and surrounded by the source electrode 72.

The shielding electrodes 75a and 75b are connected to the source electrode 72.

Therefore, according to this modification, the shielding effect can be obtained in addition to the unit gate length reduction achieved by the foregoing embodiment of FIG. 6.

In summary, according to the present invention, the noise figure NF of an ultra-high-frequency semiconductor device, e.g. FET can be reduced significantly without increasing the chip size and without additionally complicated fabrication techniques.

While the present invention has been disclosed in terms of the preferred embodiments, the invention is not limited to those preferred embodiments. The invention should be understood to include all possible embodiments and modifications of the shown embodiments which can be embodied without departing from the principles of the invention set out in the appended claims.

What is claimed is:

1. A semiconductor device comprising:
   a semiconductor substrate having a source region and a drain region formed therein;
   a gate electrode formed on said substrate;
   a source electrode formed on said substrate and electrically connected to said source region, said source electrode being located at a first side of said gate electrode;
   a drain electrode formed on said substrate and electrically connected to said drain region, said drain electrode being located at a second side of said gate electrode, said first and second sides being on opposite sides of said gate electrode; and
   means for supplying a potential for said gate electrode, said means including a plurality of gate pads connected to respectively corresponding feeding points on said gate electrode, at least one of said gate pads lying at least in part on said second side of said substrate, each other one of said gate pads lying on said first side;
   wherein said gate electrode has a length of approximately 0.05 microns, and the device has a substantially improved noise level figure as compared to a corresponding device of effectively the same size, including approximately the same gate length, but having fewer of said gate pads than said plurality thereof by the number of said gate pads lying at least in part on said second side.

2. The semiconductor device as set forth in claim 1, wherein said source electrode has at least one respective extension which extends onto said second side and at least in part between adjacent edges of said drain electrode and said at least one said gate pads located on said second side of said gate electrode.

3. The semiconductor device as set forth in claim 2, wherein said at least one gate pad lies fully on said opposite side.

4. The semiconductor device as set forth in claim 1, wherein said at least one gate pad lies at an extension of said gate electrode.

5. The semiconductor device as set forth in claim 1, comprising at least one shielding electrode essentially surrounding at least in part each said gate pad on said second side.

6. The semiconductor device as set forth in claim 5, wherein each said shielding electrode is electrically and directly connected to said substrate for grounding.

7. The semiconductor devise as set forth in claim 5, wherein each said shielding electrode is connected to said source electrode, and the device has a noise level figure of approximately 1.25.

8. A field effect transistor comprising:

a semiconductor substrate;

a plurality of gate pads;

a gate electrode on said substrate having a plurality of feeding points, each of said feeding points being connected to a corresponding one of said gate pads, said gate electrode being of an elongated configuration;

a source electrode arranged on said substrate at a first side of said gate electrode and defining at least one enclosed planar space therein which is effectively surrounded by said source electrode;

a drain electrode arranged on said substrate at a second side of said gate electrode, which second side is opposite to said first side with respect to said gate electrode; and means for supplying a potential to said gate electrode through said feeding points, said means incorporating said gate pads, said gate pads comprising at least one first gate pad arranged within said at least one enclosed planar space of said source electrode and at least one second gate pad arranged outside of said enclosed planar space and at least partially on said second side of said gate electrode;

wherein the device has a substantially improved noise level figure as compared to a corresponding device of effectively the same size and the same source electrode length, but having fewer of said gate pads than said plurality thereof by the number of said gate pads lying at least in part on said second side.

9. The field effect transistor as set forth in claim 8, wherein each said second gate pad is arranged on said substrate fully on said second side of said gate electrode.

10. The field effect transistor as set forth in claim 8, wherein two of said second gate pads are arranged essentially in alignment with linear extensions of said elongated gate electrode.

11. The field effect transistor as set forth in claim 9, which further comprises at least one shielding electrode effectively surrounding said second gate pad, and each said second gate pad is located fully on said second side.

12. The field effect transistor as set forth in claim 11, wherein each said shielding electrode is electrically connected to said source electrode.

13. The field effect transistor as set forth in claim 11, wherein each said shielding electrode is grounded.

14. A field effect transistor comprising:
a semiconductor substrate;
an elongated gate electrode;
a source electrode arranged on said substrate at a first side of said gate electrode;
a drain electrode arranged on said substrate at a second side of said gate electrode, said first and second sides being on opposite sides of said elongated gate electrode;
means for providing a plurality of feeding points for said gate electrode, through which gating potential is supplied to said gate electrode, said means including at least a first gate pad lying at least in part on said second side and a lead for connecting said first gate pad to a first one of said feeding points, said first gate pad being located in a space shielded electrically at least in part from said drain electrode by at least one shielding electrode, said source electrode extending into said second side, and at least one second feeding point connected to a second gate pad lying outside of said shielded space, each of said gate pads other than each said at least first gate pad lying at least in part on said second side being located on said first side;

wherein the transistor has a substantially improved noise level figure as compared to a corresponding device of effectively the same size, including the same length of the source and gate electrodes, but having fewer of said gate pads than said plurality thereof by the number of said gate pads lying at least in part on said second side.

15. The field effect transistor as set forth in claim 14, wherein
there is only one of said first gate pads and it lies entirely on said second side of said gate electrode, and
there are two other of said gate pads on said first side, and
the transistor has a noise figure level that is at least approximately 16% better than a comparable known device with effectively the same size and source electrode length and having said two comparable gate pads arranged comparably on said first side but not having said gate pad on said second side.

16. The field effect transistor as set forth in claim 14, which further comprises a shielding means adapted to shield said second potential source from said drain electrode.

17. The field effect transistor as set forth in claim 14, wherein said shielding means is connected to said source electrode to be grounded therethrough.

18. The field effect transistor as set forth in claim 16, wherein said shielding means is adapted to be grounded through said substrate.

19. A field effect transistor comprising:
a semiconductor substrate with a source region and a drain region formed therein;
an elongated gate electrode formed on said substrate intermediate said source region and said drain region;
a source electrode formed on said substrate and electrically connected to said source region, said source electrode being located on said substrate at a first side of said elongated gate electrode;
a drain electrode formed on said substrate and electrically connected to said drain region, said drain electrode being located on said substrate at a second side of said gate electrode, said first and second sides being on opposite sides of said gate electrode; and
means for supplying a potential to said elongated gate electrode through at least three supply points spaced at predetermined locations along said gate electrode, each of said supply points being respectively connected through an electrode connected to a bonding pad acting as a potential supply electrode, at least one of said bonding pads overlying said source region on said first side and at least one of said bonding pads being arranged at least in part on said second side, so that the length of said source electrode is about equal to that of a corresponding known device having at least two corresponding supply points on said first side for the corresponding gate electrode, with said at least two corresponding supply points of said known device being fed from two corresponding bonding pads located on the corresponding first side of said corresponding gate electrode;

wherein the device has a substantially improved noise level figure as compared to that of said corresponding known device, said corresponding known device having effectively the same size and source electrode length but having fewer of said corresponding gate pads than said plurality thereof by the number of said gate pads of the transistor lying at least in part on said second side; and whereby gating potential is supplied to said gate electrode of the transistor with reduced gate resistance, as compared to the gate resistance that would obtain if said at least one bonding pad located at least in part on said second side were located on said first side of said gate electrode, thereby avoiding the necessity of increasing the size of the transistor over that of said known device.

20. The device as set forth in claim 19, wherein at least three of said supply points are located intermediate the ends of said elongated gate electrode, a central one of said supply points being connected by an electrode to a bonding pad located on said second side of said gate electrode, the other two of said supply points being connected to respective ones of said gate pads located on said first side in respective areas that are each effectively surrounded by said source electrode, said gate electrode having a length of approximately 1.25 microns and the device having a noise level figure of approximately 1.25.

21. The device as set forth in claim 19, wherein at least a pair of said supply points are respectively located at the opposite ends of said elongated gate electrode, each of said pair of supply points being connected to respective ones of said second gate pads which are located entirely on said second side of said elongated gate electrode, at least one other of said supply points being connected to a respective one of said gate pads which is located on said first side of said gate electrode in an area which is effectively surrounded by said source electrode.

22. The device as set forth in claim 21, further including another one of said first gate pads on said second side which is connected to a central one of said supply points, an additional pair of supply points on said gate electrode being connected to gate pads located within respective openings in said source electrode.

23. The device as set forth in claim 22, wherein at least a pair of said supply points are located at the opposed ends of said elongated gate electrodes, each of said pair of supply points being connected to gate pads located on said second side of said elongated gate electrode, said gate pads lying on a longitudinal extension of said gate electrode, the other supply point being connected to a gate pad located on said first side of said gate electrode intermediate said source electrode.

24. The device as set forth in claim 20, wherein portions of said source electrode extend onto said second side and between said bonding pad on said second side of said gate electrode and said drain electrode.

25. The device as set forth in claim 20, further including a pair of shielding electrodes connected to said substrate for grounding and extending between said bonding pad and said drain electrode.

26. A semiconductor device comprising:
a semiconductor substrate having a source region and a drain region formed therein;
a gate electrode formed on said substrate, said gate electrode having a plurality of feeding points;
a source electrode formed on said substrate and electrically connected to said source region, said source electrode being located on a first side of said gate electrode;
a drain electrode formed on said substrate and electrically connected to said drain region, said drain electrode being located at a second side of said gate electrode, said first and second sides being on opposite sides of said gate electrode;
plurality of gate pads, each connected to a respective feeding point of said gate electrode, at least one first one of said plurality of gate pads being located at least in part on said second side and having an edge on said second side which is adjacent to said drain electrode; and
means for electrically shielding at least said first gate pad having said edges adjacent to said drain electrode from said drain electrode, said shielding means comprising a respective portion of said source electrode extending into said second side and along at least said edge of said first gate pad, between said drain electrode and said first gate pad.

* * * * *